(12) United States Patent
Srinivasan

(10) Patent No.: US 6,177,797 B1
(45) Date of Patent: Jan. 23, 2001

(54) RADIO-FREQUENCY COIL AND METHOD FOR RESONANCE/IMAGING ANALYSIS

(75) Inventor: Ravi Srinivasan, Richmond Heights, OH (US)

(73) Assignee: Advanced Imaging Research, Inc., Cleveland, OH (US)

(*) Notice: Under 35 U.S.C. 154(b), the term of this patent shall be extended for 0 days.

(21) Appl. No.: 08/993,932

(22) Filed: Dec. 18, 1997

Related U.S. Application Data

(60) Provisional application No. 60/033,611, filed on Dec. 19, 1996.

(51) Int. Cl.[7] .................................................. G01V 3/00
(52) U.S. Cl. .................................... 324/318; 324/322
(58) Field of Search ..................... 324/318, 322, 324/312, 314, 307, 309, 300

(56) References Cited

U.S. PATENT DOCUMENTS

| | | |
|---|---|---|
| 4,411,270 | 10/1983 | Damadian . |
| 4,793,356 | 12/1988 | Misic et al. . |
| 4,799,016 | 1/1989 | Rezvani . |
| 4,820,985 | 4/1989 | Eash . |
| 4,825,162 | 4/1989 | Roemer et al. . |
| 4,833,409 | 5/1989 | Eash . |
| 4,943,775 | 7/1990 | Boskamp et al. . |
| 5,057,778 | 10/1991 | Rath . |
| 5,144,240 | 9/1992 | Mehdizadeh et al. . |
| 5,208,534 | 5/1993 | Okamoto et al. . |
| 5,258,717 | 11/1993 | Misic et al. . |
| 5,270,656 | 12/1993 | Roberts et al. . |
| 5,382,903 | 1/1995 | Young . |
| 5,521,506 | 5/1996 | Misic et al. . |
| 5,543,711 | * 8/1996 | Srinivasan et al. ................... 324/318 |
| 5,548,218 | 8/1996 | Lu . |
| 5,592,088 | 1/1997 | Matsunaga et al. . |
| 5,602,479 | * 2/1997 | Srinivasan et al. ................... 324/318 |
| 5,646,531 | * 7/1997 | Renz ..................................... 324/318 |
| 5,680,047 | 10/1997 | Srinivasan et al. . |

OTHER PUBLICATIONS

International Search Report related to PCT Patent Application No. PCT/US98/03529 dated Jul. 16, 1998.

"A Comprehensive Analysis for Estimating Modes in Coupled Resonators" by Ravi Srinivasan and Haiying Liu, pp 1425.

"Examples of the Design of Screened and Shielded RF Receiver Coils", by Michael Burl and Ian R. Young, pp 326–330.

* cited by examiner

Primary Examiner—Louis Arana
(74) Attorney, Agent, or Firm—Renner, Otto, Boisselle & Sklar

(57) ABSTRACT

An RF coil with high signal-to-noise (S/N) and $B_1$ homogeneity over the volume originating from the arctic arch and extending to the top of the head, which is highly desirable for quantitative (anatomical, vascular and functional) studies in-vivo. The coil is suitable for use in performing multiple studies and reducing scan time without patient repositioning. Moreover, the coil is capable of imaging in different operating modes. A split-top design is used to ease patient access.

34 Claims, 9 Drawing Sheets

NORMALIZED, CORONAL CONTOUR @ Y=0

NORMALIZED, SAGITTAL CONTOUR @ X=0

RADIO-FREQUENCY COIL AND METHOD FOR RESONANCE/IMAGING ANALYSIS

CROSS-REFERENCE TO RELATED APPLICATION

This application claims the benefit of U.S. Provisional Patent Application No. 60/033,611, filed Dec. 19, 1996.

TECHNICAL FIELD

The present invention relates generally to resonance systems, such as magnetic resonance imaging (MRI) systems, and more particularly to a radio-frequency (RF) coil and method for use in such systems.

BACKGROUND OF THE INVENTION

In MRI systems or nuclear magnetic resonance (NMR) systems, a static magnetic field $B_0$ is applied to the body under investigation to define an equilibrium axis of magnetic alignment in the region of the body under examination. An RF field is then applied in the region being examined in a direction orthogonal to the static $B_0$ field direction, to excite magnetic resonance in the region, and resulting RF signals are detected and processed. Generally, the resulting RF signals are detected by RF coil arrangements placed close to the body. See for example, U.S. Pat. No. 4,411,270 to Damadian and U.S. Pat. No. 4,793,356 to Misic et al. Typically such RF coils are either surface type coils or volume type coils, depending on the particular application. Normally separate RF coils are used for excitation and detection, but the same coil or array of coils may be used for both purposes. For multiple surface RF coils for use in NMR, see U.S. Pat. No. 4,825,162 to Roemer, et al., and for multiple volume coils for use in NMR, see U.S. Pat. No. 5,258,717 to Misic, et al.

A quadrature type coil was introduced by Hayes in 1985 to the NMR community. This coil was readily adopted by scientists and engineers in the NMR community for several volume applications (e.g., body, head, knee, wrist). The coil provided a 41% improvement in signal-to-noise ratio (S/N), a reduction of transmit power by a factor of two and a high degree of $B_1$ homogeneity over the imaging field-of-view (FOV). The principal quadrature mode of this coil has two linear modes, oriented orthogonal to one another. Additional details regarding such a coil design are found in U.S. Pat. No. 4,783,641 to Hayes, et al.

The recent introduction of array coils to NMR has led to commercially available CTL coils for entire spine imaging, and flexible body arrays for torso imaging. These multi-channel coils also significantly help reduce scan times. Should there be any brain trauma in conjunction with the c-spine injuries most common in automobile accidents, this necessitates two studies to be performed. Currently, two coils and more particularly two patient settings are required to perform a combined head and neck study (see, e.g., N. Krause, et al. "Quadrature-Head Coil and Helmholtz-Type Neck Coil—an Optimized RF-Antenna-Pair for Imaging Head, Neck and C Spine at 1.0T and 1.5T", SMRM, 7th Annual Meeting, San Francisco, Book of Abstracts, page 845, 1988). A routine MR study takes approximately 45 minutes, including the patient placement. Thus a combined head and neck study approximates an hour-and-half, and requires that the patient be moved between studies for coil replacement. This is uncomfortable especially for claustrophobic patients in general. In addition, prolonged scan times make the contrast-enhanced studies even more difficult to obtain.

In such cases of cranio-spinal trauma, a head and neck coil will help obtain important clinical information without compromising image quality over extended FOV's. This will also be true in the cases of vascular imaging of the carotids originating from the arctic arch and extending to the circle of willis, and for oncological imaging of the head and neck tumors, without moving the patient. A head and neck array will help reduce patient discomfort while reducing the scan times and increase the patient throughput by up to a factor of two in a MR scanner.

Array type coil designs have been disclosed in the prior art. For example, two birdcage resonators (one for the head, another for the neck) have been overlapped for minimum mutual inductance (see FIG. 1). The neck birdcage 10 was asymmetric and had cutouts to accommodate the shoulders of patients. When this asymmetric birdcage was overlapped to the symmetric head birdcage 12, the individual modes were affected differently. Such an array design is discussed in C. Leussler, "Optimized Birdcage Resonators for Simultaneous MI of Head and Neck", SMRM 12th Annual Meeting, New York, Book of Abstracts, page 1349, 1993.

Referring still to FIG. 1, since the anatomy introduced in the two coils was different, the individual linear modes of the two coils 10, 12 were perturbed in different ways, causing the linear modes to misalign and reduce the isolation between modes in a coil. This in turn affected the isolation with the linear mode in the neighboring coil, thus affecting the isolation between coils in the array. Thus, the optimum overlap for one linear mode was not optimum for the second linear mode of the same coil. Moreover, poor isolation between coils affected the coil matching which in turn affected the alignment and isolation of modes in the individual birdcage which in turn affected the isolation between coils in the array. Therefore, optimization of this coil design (tuning, matching, isolation, alignment of modes of coils in the array) was very complex, iterative and often time consuming, thus making the manufacturing process extremely difficult. In addition, this coil design presented added claustrophobia to patients and therefore was not acceptable for clinical imaging.

FIG. 2 illustrates another array design which included a birdcage coil 14 for the head, and a distributed type quadrature planar pair 16 for the neck. (See, e.g., Srinivasan, R, et al. "A Multi-Modal, Split-Top Head and Neck Vascular Array for MRI", SMR 3rd Scientific Meeting, Nice, France, Book of Abstracts, page 977, 1995; and U.S. Pat. No. 5,543,711to Srinivasan, et al.). The neck coils were overlapped with the head birdcage 14 independent of the other. This was possible, because the neck coils were intrinsically isolated from one another. Although this design was more elegant than the above two coil designs, the sensitivity of the coil in the N mode (neck mode) was under that of the commercially available, adjustable whole-volume neck coil. The characterization of this deficit was difficult because of the dilemma of comparing surface type coil S/N to that of the helmholtz type volume coil. In any case, identical clinical scans obtained from the same volunteers clearly showed such a deficit.

The surface coil design emphasized signals from surfaces close to the coil. Therefore, shimming with this coil was difficult and fat suppression was a challenge. The axial neck images displayed un-even signal intensities in the vertical direction. Also, extended FOV sagittal/coronal images of the head and neck displayed a discontinuity at the coil overlap which affected the overall appearance of the image. This also made the windowing of the images difficult. In order to correct for the uneven signal intensities, a new image intensity correction software was employed (based on the RF coil profile), which slowed the image combination process. In addition, the linear modes of the coil were interfaced to the multiple channels of the MR system, which further reduced the image reconstruction process.

In view of the aforementioned shortcomings associated with existing coil designs, there is a strong need in the art for a quadrature array design that provides a high S/N and uniform coverage over the head and neck areas, and which obviates the need for two separate coils and the additional image correction software.

SUMMARY OF PRESENT INVENTION

The present invention provides an RF coil with high signal-to-noise (S/N) and $B_1$ homogeneity over the volume originating from the arctic arch and extending to the top of the head, which is highly desirable for quantitative (anatomical, vascular and functional) studies in-vivo. The coil is suitable for use in performing multiple studies and reducing scan time without patient repositioning. Moreover, the coil is capable of imaging in different operating modes. A split-top design is used to ease patient access.

The present invention provides high image quality (image S/N and homogeneity) by introducing a multichannel RF coil array with a unique combination of quadrature volume and surface coils. Coil-to-coil decoupling electronics are introduced that facilitate multiple mode operation without compromising S/N. These features help provide head and neck imaging over the extended FOV in one clinical setting, without significantly compromising image quality.

According to a preferred embodiment, an RF coil in accordance with the present invention has two counter-rotating, helmholtz pairs arranged orthogonally to constitute a quadrature pair forming a first coil, a quadrature volume birdcage forming a second coil, and a modified spoke type quadrature surface coil representing a third coil. Furthermore, coil-to-coil decoupling electronics are provided. All the coils are overlapped to maintain a minimum mutual inductance and hence minimal cross-talk. The first coil coverage originates from the arctic arch and extends to the brain stem. The second and third coils permit a combined coverage that originates from the c-spine and extends to the top of the head. Depending on the operating mode, individual coils in the array can be turned OFF or ON by a programmable transmit/receive (T/R) driver in the MI system. Passive coil-to-coil decoupling electronics that include coaxial cable traps serve to (1) break any closed ground loops during RF transmit; (2) minimize any residual cross-talk between coils; and (3) permit efficient multiple mode operation.

In general, the improved S/N and uniform coverage over the head and neck as provided by the RF coil of the present invention will translate into improved image quality, enhanced diagnostic accuracy, and increased patient throughput. The coil provides broad use in examinations of the brain, skull, face, neck, cervical spine, and blood vessels in patients with craniospinal traumatic injuries, stroke and other cerebrovascular disorders, and head and neck cancer, etc.

According to one particular aspect of the invention, a radio-frequency (RF) coil apparatus for resonance imaging/analysis is provided. The RF coil apparatus includes a first quadrature volume coil; a second quadrature volume coil at least partially overlapping the first quadrature volume coil; and a quadrature surface coil at least partially overlapping the second quadrature volume coil.

According to another aspect of the invention, a radio-frequency (RF) coil apparatus for resonance imaging/analysis is provided. The RF coil includes an RF volume coil sensitive to RF signals produced during resonance imaging/analysis; and an RF surface coil, also sensitive to the RF signals, physically positioned relative to the RF volume coil to share a common axis and to produce an overlap of the magnetic B fields of the respective coils at a frequency of the RF signals.

According to yet another aspect of the invention, a radio-frequency (RF) coil apparatus for resonance imaging/analysis is provided which includes a first quadrature volume coil; a second quadrature volume coil at least partially overlapping the first quadrature volume coil; a quadrature surface coil at least partially overlapping the second quadrature volume coil; and coil-to-coil decoupling circuitry for preventing closed ground loops.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENTS

Figure 1:
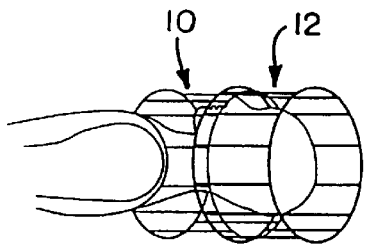
FIG. 1 is a perspective view of a conventional two birdcage type RF coil, one birdcage resonator used for the head and the other birdcage resonator used for the neck.
Figure 2:
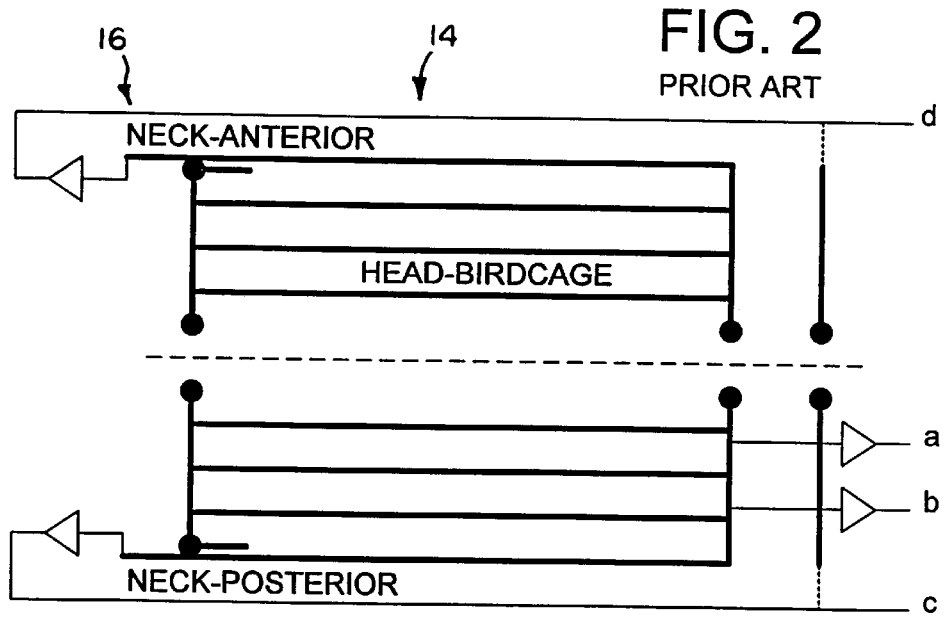
FIG. 2 is a schematic view of a conventional RF coil which combines a birdcage coil for the head and a distributed type quadrature planar pair for the neck.

The invention will now be described with reference to the drawings, wherein like reference numerals are used to refer to like elements throughout.

Figure 3:
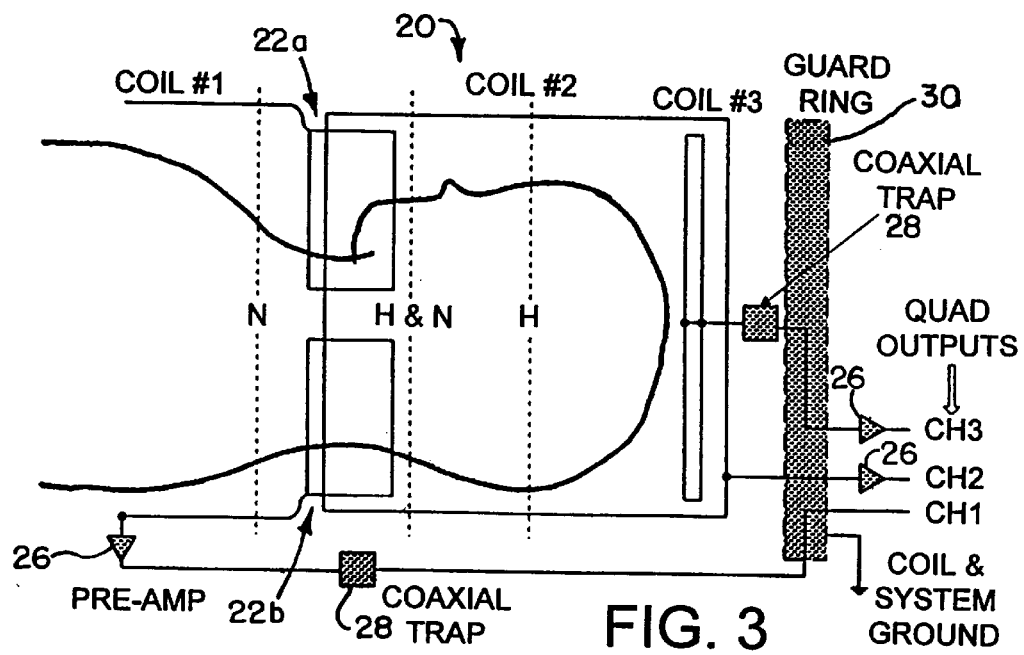
FIG. 3 is a schematic view of an RF coil having a quadrature pair coil, a birdcage coil, and modified-spoke type quadrature surface coil in accordance with a preferred embodiment of the present invention.

Referring now to FIG. 3, an RF coil array (herein referred to as an "RF coil") in accordance with a preferred embodiment of the present invention is generally designated 20. The RF coil 20 is designed as a split-top array having two counter-rotating, helmholtz pairs 22a, 22b arranged orthogonally to constitute a quadrature pair designated as coil #1. In addition, the coil 20 includes a quadrature volume birdcage (coil #2) and a modified spoke type quadrature surface coil (coil #3), and includes coil-to-coil decoupling electronics. Only the coil outlines are shown, for brevity. All the coils are overlapped to maintain a minimum mutual inductance and hence minimal cross-talk. Coil #1 coverage originates from the arctic arch and extends to the brain stem. Coil #2 and coil #3 permit a combined coverage that originates from the c-spine and extends to the top of the head. Coils #1–#3 provide, as inputs/outputs, signals at terminals labeled CH1—CH3, respectively. The shaded areas include the preamplifiers 26, and coil-to-coil decoupling electronics 28 including the coil grounding. Low-noise preamplifiers 26 (NF<0.55 dB) are included in every channel CH1—CH3 to maintain high S/N. Passive coil-to-coil decoupling electronics that include the coaxial cable traps 28 serve three main functions, namely to (1) break any closed ground loops during RF transmit; (2) minimize any residual cross-talk between coils; and (3) permit an efficient multiple mode operation. A guard ring 30 serves as a common ground for the entire array.

As is discussed in greater detail below, the coil 20 represents a unique combination of several quadrature volume and surface coils. The coil 20 combines a modified quadrature surface coil design with an asymmetric overlap of the modified surface coil to the volume birdcage and unique coil-to-coil decoupling electronics.

The clinical features of the coil 20 are found in its multiple mode operation, viz., (1) head only studies H; (2) volume neck or c-spine studies N; and (3) extended FOV head and neck studies H&N. Depending on the operating mode, individual coils (coils #1–#3) in the array 20 can be turned OFF or ON by the programmable Transmit/Receive (T/R) driver in the MRI system. This array coil will be interfaced to a Picker 1.5T Edge Multichannel MRI system which is commercially available from Picker International, Inc., Highland Heights, Ohio, U.S.A.

By selectively enabling/disabling the coupling/decoupling circuitry in the respective coils, each of the coils #1–#3 can be selectively made resonant (ON) or non-resonant (OFF). Table 1 shows the status of each of the coils #1–#3 for the respective operating modes. Each of the coils #1–#3 is described in detail below.

TABLE 1

| Operating Modes | Individual Coil Status | | |
|---|---|---|---|
| | Coil #1 | Coil #2 | Coil #3 |
| Head (H) | OFF | ON | ON |
| Neck (N) | ON | OFF | OFF |
| Head and Neck (H & N) | ON | ON | ON |

$B_1$ Field Simulations:

According to one specific example, coil #2 was configured as a 16 leg birdcage which was 28 cm in diameter and 28 cm long. The modified quadrature surface coil #3 was 22.5 cm in diameter, 2 cm long with 8 spokes, a σ of 0.4 and a VG1, VG2 diameter of 4.0 cm. The overlap between coils #2 and #3 was 4.0 cm. Loop I (FIGS. 6 and 7) in the neck coil (coil #1) was 24 cm long, 14 cm wide at the straight segment, and maintained a 90° arc. This arc began @10° and extended to 100°. The diameter of the arc was 23 cm, whereas the straight segments at the chest traversed on a horizontal plane located at 14 cm along the vertical axis. All remaining loops maintained identical dimensions.

Figure 4A:
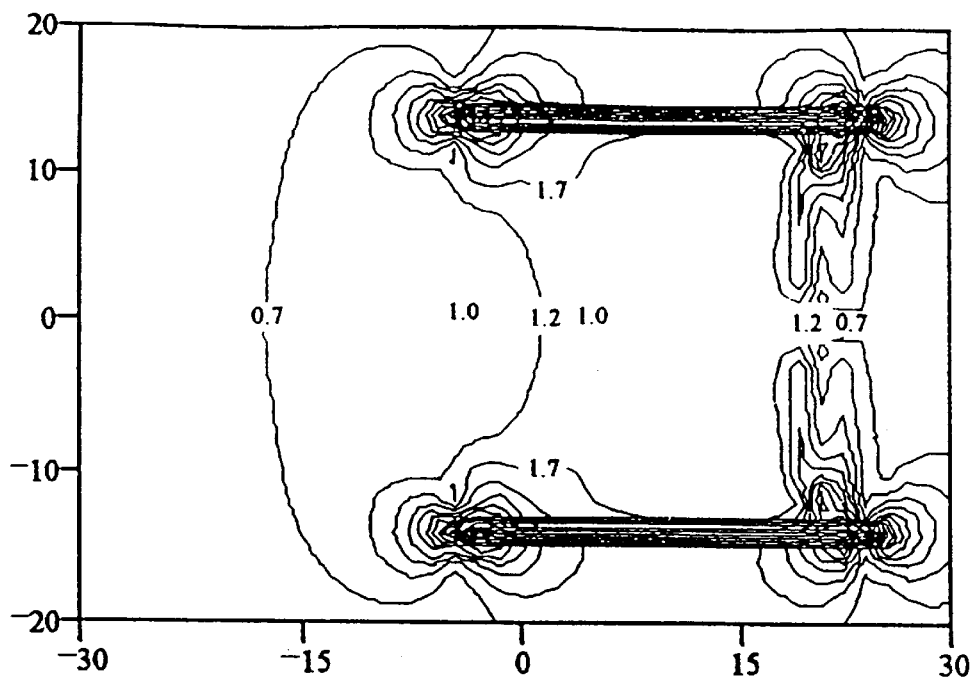
FIGS. 4a and 4b represent a normalized coronal contour @Y=0 and normalized sagittal contour @X=0, respectively, for an RF coil having the exemplary dimensions provided herein in accordance with the present invention.
Figure 4B:
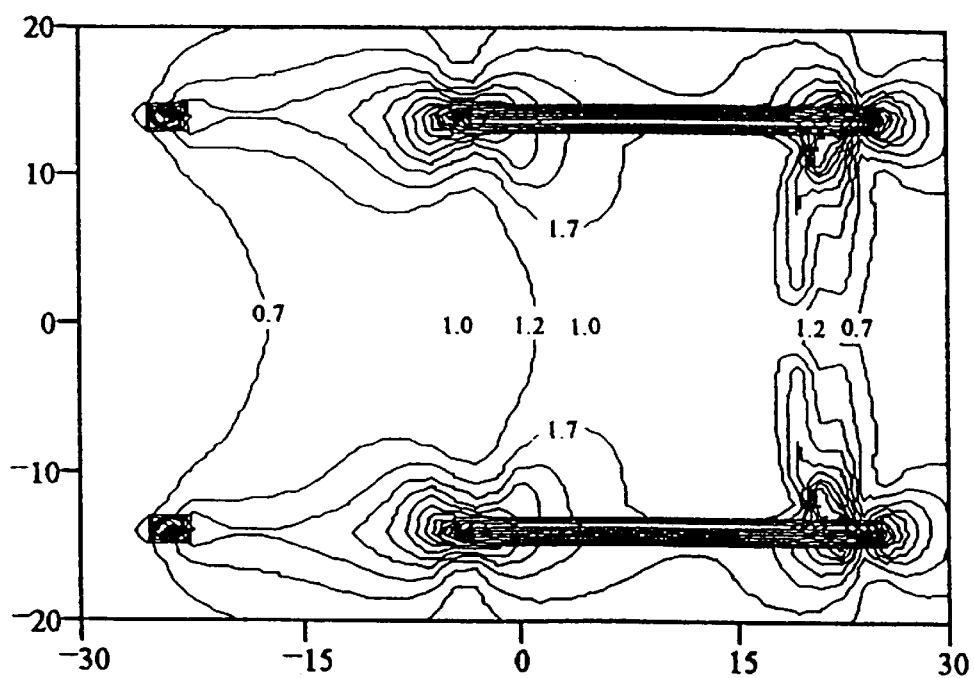

Finally, using the dimensions of the head coils (coils #2, #3) and the neck coil (coil #1) mentioned above and setting the overlap between coils #1 and #2 to 2.5 cm, B field contours were generated. Here the contours were normalized to a point along the dotted line of the H&N mode of FIG. 3. Extended coronal and sagittal contours over a 60 cm FOV are shown in FIGS. 4a and 4b, respectively. It is to be noted that over a 38 cm FOV, the contour lines vary from 1.2 to 0.7, indicating that there is a 40% change in signal intensity. It is noted that much of the neck anatomy of interest (c-spine) is either below or (arctic arch) much above the central line and will lay in or near the 1.2 contour line. However for a smaller patient, the arch and the neck may lay around the 1.0 contour line. It is further noted that in the preferred embodiment the anterior neck segments will be fixed to reduce the mechanical complexity of an already complex design. The signal intensity of the neck coil (coil #1) may be improved by adding a birdcage instead of a cross-helmholtz design. In this case, the coil will become extremely claustraphobic with the additional technical disadvantage of the coil optimization as mentioned in the prior art section.

It is also noted that the homogeneity significantly improved in the neck region in the H&N mode, when compared to the N mode. In doing so, the homogeneity over the entire brain inside the head coil virtually remained the same. And the areas at the coil overlap, where both the head coil (coil #2) and the neck coil (coil #1) dropped in signal intensity in their respective modes, now gained significantly in the H&N mode. This is specially useful for detecting the tumors located at the skull base. Furthermore, it is noted that in addition to imaging the head or the neck and the combined coverage of the head and neck, this coil 20 will assist in imaging the skull base tumors, the brachial plexus and in the MR angiography of the left and right sub-clavian arteries originating from the arctic arch.

Figure 5:
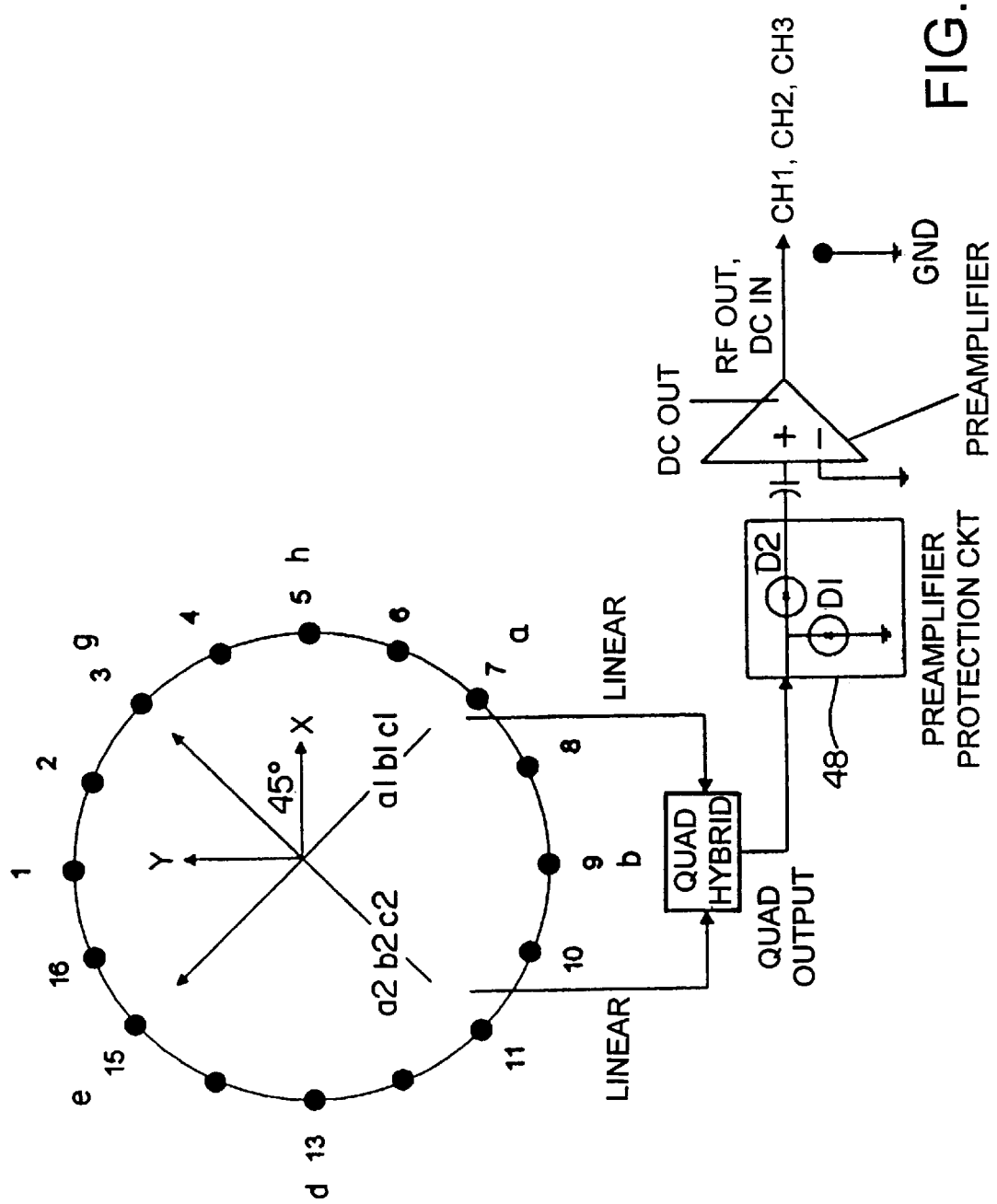
FIG. 5 illustrates the preferred mode orientations in accordance with the present invention.

Coil Mode Orientation:

Referring to FIG. 5, the preferred mode orientations for coils #1, #2 and #3 are shown. The individual linear modes a1, a2 and b1, b2 and c1, c2 of the three respective coils, in the proposed array 20, will be tuned and matched to 50 ohms at the NMR frequency. Individual coil linear ports will be summed by separate quadrature hybrids prior to the corresponding preamplifiers. The three coils will be actively decoupled during whole-body RF transmit. Although this will achieve an approximate −25 dB of isolation per coil at the NMR frequency, additional series-shunt pin-diode protection (D1, D2) circuits introduced will present another −45 dB of isolation between the coil and the preamplifier in every channel. A forward biased D1 will shunt any RF present in the signal conductor to ground during body RF transmit, while D2 is reverse biased. During receive D2 is forward biased and D1 will be reverse biased, to let all the NMR signals pass through the corresponding preamplifiers. This diode network along with the coil active decoupling will drastically reduce the amount of RF seen at the input of every amplifier. This will ensure a safe preamp operation (preamplifier input maximum is 20 dBm). Individual preamp outputs will then be channelled to the system for further amplification.

Figures 6, 7:
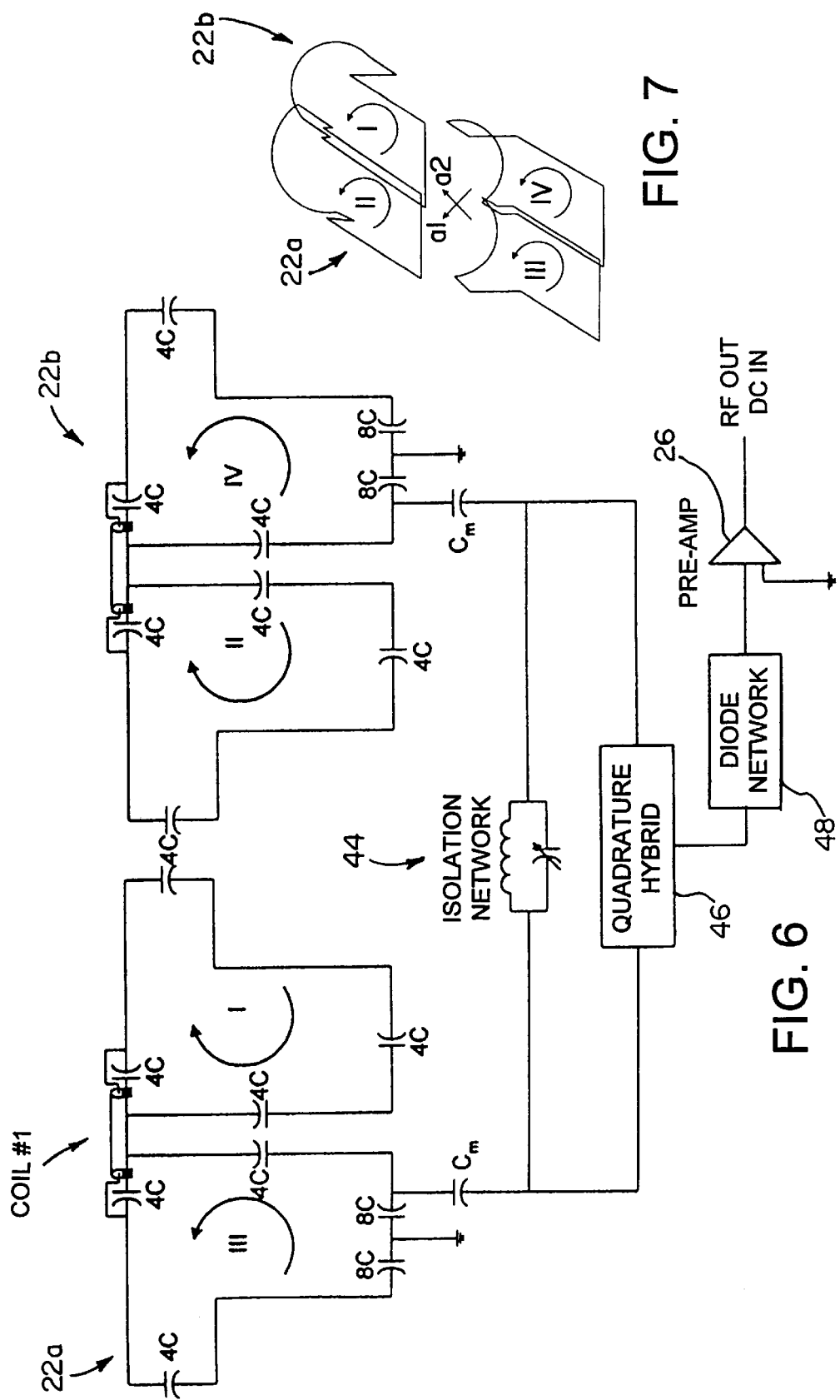
FIG. 6 is a planar schematic illustration of the neck coil in accordance with the preferred embodiment of the present invention.
FIG. 7 is a schematic illustration representing the orientation of the loops within the neck coil of FIG. 6 in accordance with the present invention.

Neck Coil:

A planar schematic of the cross-helmholtz type, quadrature neck coil (coil #1) is shown in FIG. 6. The quadrature neck coil (coil #1) consists of four loops I, II, III and IV, respectively. Loops I and III (22a) and loops IIand IV (22b) are coupled to form a2 and a1 modes, respectively. Modes a1 and a2 form a quadrature pair. Loops I and IIII are diagonally opposite to one another and oriented at right angles to loops II and IV, respectively. Loops I and II and loops III and IV are overlapped to maintain minimum mutual inductance and hence minimal cross-talk. Their configuration is depicted in FIG. 7.

Loops I and III mutually coupled to one another will give rise to two modes, one that is in-phase and another that is out-of-phase. That is, the two loops mutually coupled will give rise to a counter-rotating and a co-rotating mode, respectively. Since the two loops are placed opposite to one another, the B field generated by the counter-rotating currents in the two opposite loops will add between the region between the two coils. Whereas the co-rotating currents in the two loops will result in a almost linear B field gradient, which is not desired for homogeneous imaging. This B field gradient may however be used for rotating frame experiments, where a RF gradient is desired. However, for homogeneous imaging, the counter-rotating mode is sought and is therefore the linear mode of interest. This however will depend on how the two loops are hard-wired. With the convention shown, the counter-rotating mode will provide a homogeneous field at the coil center.

Loop III may be broken with four similar value capacitors, 4C in value. One 4C value capacitor may further be broken in to two capacitors 8C in value. The center point of the two 8C value capacitors which happens to be a virtual point ground will be forced to real ground. This will prevent any currents to flow on the shields of coaxial cables and will obviate the need for cable traps and such mechanisms to break the ground loops. The coil will then be matched with Cm to 50 ohms. Loop IV will be identically matched to 50 ohms. If the isolation between the I, III pair and the II, IV pair is not satisfactory (<−20 dB), then the additional isolation network 44 shown may be used to further isolate the individual linear modes. Typical values for the L-C pair in the isolation circuit for 64 MHz are 124 nH and 50 pF, respectively. The capacitor value may be increased or decreased to present a capacitive or an inductive effect. This circuit has been used in many RF coil array designs and have isolated coils to less than −20 dB, on a routine basis.

A quadrature hybrid 46 discussed in the birdcage section will be used for this coil as well. A similar diode network 48 discussed above in FIG. 5 will be used for preamp protection. Also, a low-noise preamp 26 (NF<0.55 dB) will be incorporated in the circuitry prior to the system amplification. The helmholtz loops will be actively decoupled with active pin diodes. A parallel trap will be created across the 4C value capacitors by using a suitable inductor value, to resonate at the NMR frequency. This parallel trap will present a high impedance to the circulating RF currents and thus behave like an open circuit during body RF transmit. However during receive, the diodes will be reverse biased thus opening the decoupling circuit and the entire coil will be resonant at the NMR frequency as shown in FIG. 6. One such active decoupling circuit is described in the modified surface coil section.

Figure 8:
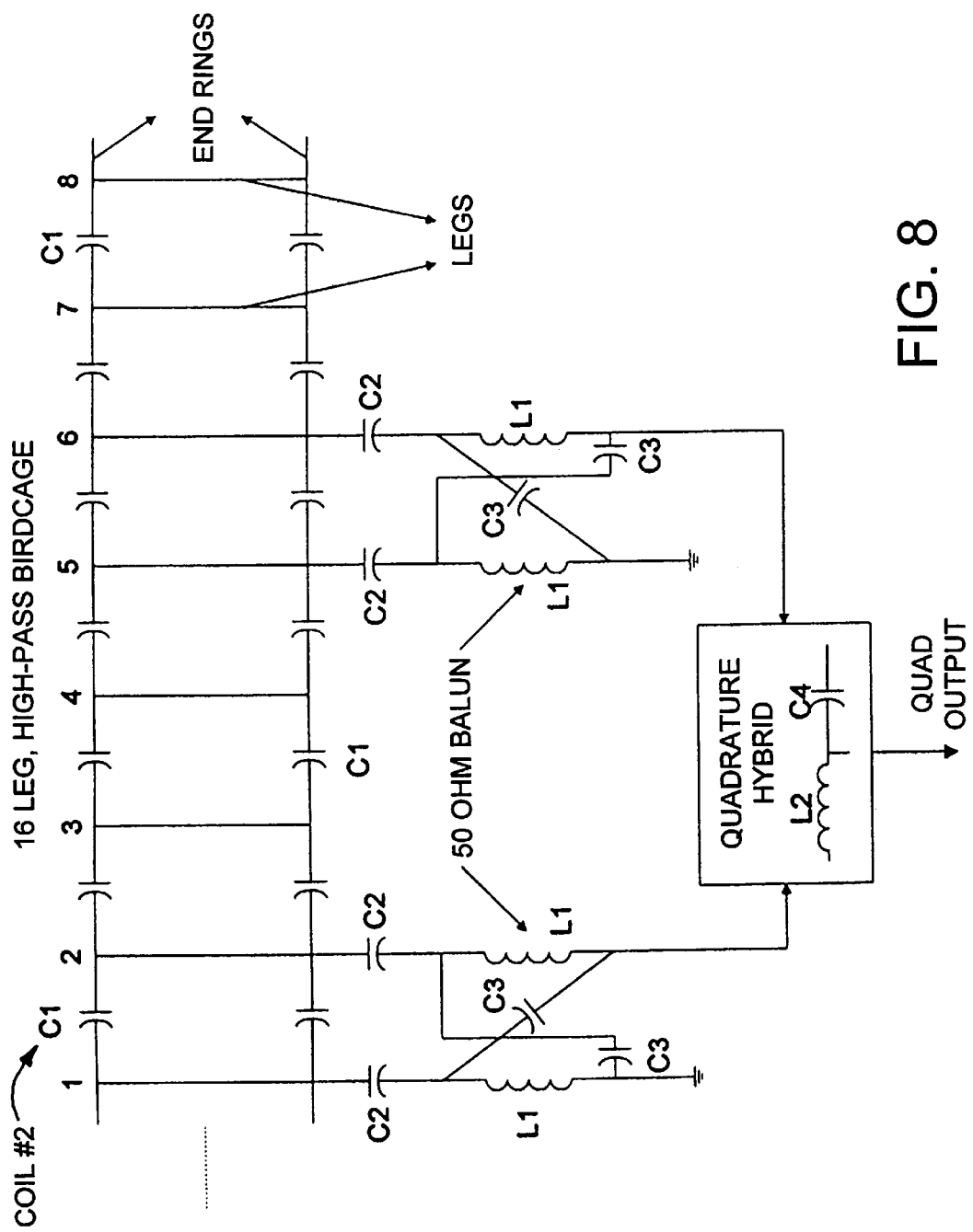
FIG. 8 is a schematic illustration of the birdcage coil in accordance with the preferred embodiment of the present invention.

High-Pass Birdcage Coil:

A planar schematic of an exemplary birdcage coil (coil #2) is shown in FIG. 8. In such exemplary embodiment, the birdcage coil #2 is a 16 leg high-pass birdcage. Here the end rings are broken with sixteen similar value capacitors C1. This coil has eight degenerate modes, of interest is the principal quadrature mode. Balanced matching to the individual ports is accomplished with two C2 capacitors across C1. These are then followed by a criss-cross type 50 ohm balun network (L1-C3, L1 is 124 nH, C3 is 50 pF), needed to transform to an unbalanced match prior to the analog quadrature hybrid. The fourth ports of these baluns are tied to a common ground. Although a standard Wilkinson design may be used for the hybrid, a two element (L2-C4, L2 is 124 nH, C4 is 50 pF) hybrid is proposed for simplicity. If $S_1$, $S_2$ denote the signals from the two linear ports and S denotes the signal output, then the mathematical expression for the combination is:

$$S = \sqrt{0.5(S_1^2 + S_2^2 + 2S_1 S_2 \sin\alpha)} \qquad (1)$$

Since the signals are equal in magnitude and orthogonal in phase, setting α to 90° will yield a 41% improvement in quadrature S/N. It is noted that the individual linear modes of the birdcage (coil #2) will be aligned to the preferred mode orientations of FIG. 5. This will ensure a balanced head loading of the two linear ports with similar Q values and sample noise contributions. One C1 capacitor in each of the 16 meshes of the birdcage (coil #2) will be decoupled with a pin diode and a suitable inductor as described in the above section.

Figure 9A:
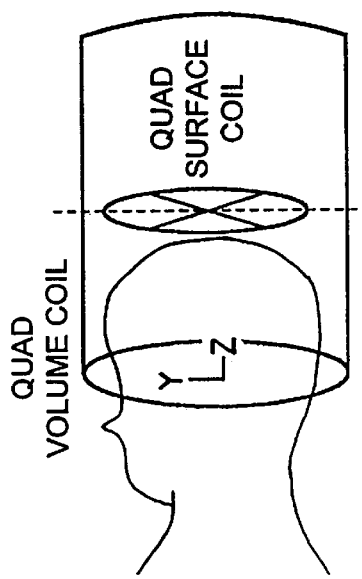
FIG. 9a of a schematic diagram of a quadrature surface coil symmetrically overlapped with a conventional birdcage coil with reduced usable imaging field of view.

Modified Quadrature Surface Coil:

The modified quadrature surface coil (coil #3) is of particular importance. Normally, a planar linear or quadrature surface coil will exhibit identical B field distributions on either side of the coil. For this coil to be overlapped with a conventional birdcage, the suitable position where minimal cross-talk was achieved would be at the central virtual ground plane of the birdcage (see FIG. 9a). But since the head was only partially covered by this assembly, this resulted in a markedly reduced usable imaging FOV. This was unacceptable.

Figure 9B:
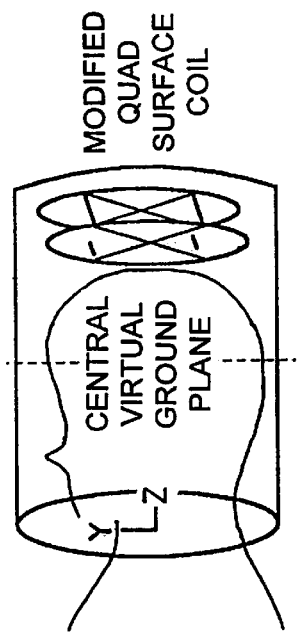
FIG. 9b is a schematic diagram of a modified quadrature surface coil asymmetrically overlapped with a birdcage coil in accordance with the preferred embodiment of the present invention.

However, when the profile of the surface coil was modified from one side to the other, this facilitated an asymmetric overlap of the coils (see FIG. 9b). That is, the surface coil was allowed to be placed toward one end ring of the birdcage and the coils were still isolated from one another. The surface coil placement was mandated by its asymmetric B field profile on either side of the coil. Such a prototype has been built by the inventor, and confirmed the overlap with the conventional head coil and have obtained S/N data from phantoms. Volunteer images clearly displayed high S/N toward the top of the head. Further details may be found in R. Srinivasan, "*S/N Improvement in a Conventional Head Coil Toward Top of the Head*", submitted to 5th ISMRM, Vancouver, British Columbia, 1997. This coil design presents an elegant solution to increasing the S/N toward the top of the head without compromising image quality. Details regarding the coil #3 are found in U.S. patent application Ser. No. 08/745,893 by Srinivasan, the entire disclosure of which is incorporated herein by reference.

Figure 10:
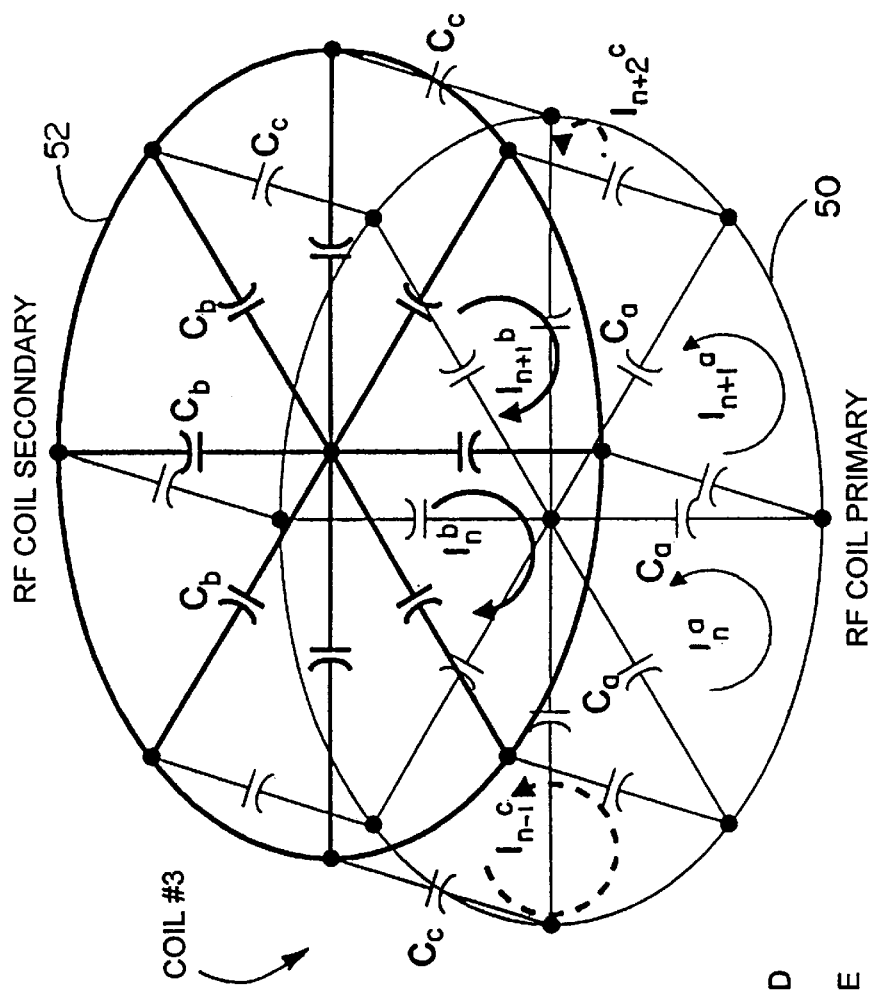
FIG. 10 is a detailed schematic illustration of the modified quadrature surface coil of FIG. 9b in accordance with the present invention.

A modified, quadrature surface coil (coil #3) is shown in FIG. 10. This consists of a RF coil primary 50, a RF coil secondary 52 and coupling impedances Cc that couple the primary 50 to the secondary 50. Here, the primary 50 and the secondary 52 are coupled mutually through space and electrically through Cc. The primary 50 and secondary 50 are also coupled to the meshes that connect the primary and the secondary. For such a periodic structure (primary mesh "a", secondary mesh "b" and the corresponding mesh connecting the primary and secondary "c"), eigenmode solutions correspond to currents that are in-phase by a factor of $e^{-j\beta}$ from mesh to mesh, with the requirement that the total phase change $N\beta$ be a multiple of $2\pi$, thus $N\beta = 2\pi k$ for the $k^{th}$ mode. By considering standing wave solutions around the ring structure, one may write that $I_n = I_1 \cos 2\pi k(n-1)/N$, for the $n^{th}$ mesh. Kirchoff's mesh equations can be written for "a", "b" and "c" meshes and can be solved using the similar approach of reference 10, thus arriving at the following solution for the $k^{th}$ order mode;

$$(\omega_k^2)^2 = \frac{1}{1+\sigma}\left[\omega_k^2\left(1 - \sigma\frac{Mba}{Laa}\right) - \omega_{ak}^2\frac{] [\omega_k^2 - \omega_{ck}^2]}{\left[\frac{Mac}{Laa}\right]\left[\frac{Mac}{Lcc}\right]}\right] \quad (2)$$

where, $$\omega_{ak}^2 = \frac{\frac{4}{C_a}\sin^2\pi\frac{k}{N}}{Laa}, \omega_{bk}^2 = \frac{\frac{4}{C_b}\sin^2\pi\frac{k}{N}}{Lbb}, \omega_{ck}^2 = \frac{\frac{4}{C_c}\sin^2\pi\frac{k}{N}}{Lcc} \quad (3)$$

and $$Laa = L_{nn}^{aa} - 2\sum_{j=1}^{\frac{N}{2}-1} M_{jn}^{aa}\cos\frac{2\pi k}{N}j - M_{n+\frac{N}{2},n}^{aa}\cos\pi k \quad (4)$$

$$Mba = 2\sum_{j=1}^{\frac{N}{2}-1} M_{jn}^{ba}\cos\frac{2\pi k}{N}j + M_{n+\frac{N}{2},n}^{ba}\cos\pi k + M_{nn}^{ba}$$

Here Mac and Lcc will have terms similar to that of Mba and Laa, respectively. N is the total number of meshes, and $\omega_{ak}^2$, $\omega_{bk}^2$ and $\omega_{ck}^2$ are frequency squared for isolated structures "a", "b" and "c", respectively. Should structures "a" and "b" be only mutually coupled, that is, should coupling impedances be open, then equation 3 will reduce to $$(\omega_k^2)^2 = \frac{(\omega_k^2 - \omega_{ak}^2)(\omega_k^2 - \omega_{bk}^2)}{\left[\frac{Mab}{Laa}\right]\left[\frac{Mab}{Lbb}\right]} \quad (5)$$

Self and mutual inductances can be computed using computer models and using Neumann formulae (see, e.g., Plonsey, R. And R. E. Collin. "*Principles and Applications of Electromagnetic Fields*". McGraw Hill Book Company, New York, page 275–276, 1961), or can be measured using the tedious method of Tropp (see, e.g., J. Tropp. "*Mutual Inductance in the Birdcage Resonator*", SMR 12th Annual Meeting, August 14–20, New York, page 1347, 1993). The inventor has used the former method and predicted frequency modes for the coupled dome resonators to within 2% of the measured data (see, e.g., Srinivasan. R, et al, "*A Comprehensive Analysis for Estimating Modes in Coupled Resonators*", SMR 4th Annual Meeting, New York, April 27–May 3, page 1425, 1996). However, for simpler circuits, Tropp's method may prove to be efficient and may be used to compare the results from the computer simulations.

A question which remains is how to compute the secondary currents. This may be accomplished by setting $I_b = \sigma I_a$, in the Kirchoff's equations for mesh currents, before solving for $\omega_k$. A simpler alternative is to populate the coil with known value capacitors and measure the mode frequencies of the individual circuits and the entire coil. The mutual inductances may be calculated or measured as previously described. Once this is accomplished, precise capacitor values and hence σ can be computed using this data and the equations provided, to resonate the coil at the NMR frequency.

In the above-discussed prototype coil, the RF coil primary was inductively coupled to the RF coil secondary. The RF coil secondary produced an inductive or a capacitive effect depending on its resonance frequency. That is, if the RF coil secondary was tuned to a frequency higher than the NMR frequency then it produced a capacitive effect on the RF coil primary. Here, the currents in the RF coil primary and the secondary were in-phase and there was little or no shielding.

However, when the RF coil secondary was tuned to a lower frequency, then it produced an inductive effect. This effect depended on the isolated frequency of the RF coil secondary. Closer the isolated frequency of the RF coil secondary to the NMR frequency, more was the inductive effect and greater were the current fractions on the RF coil secondary. However, the currents were out-of-phase with respect to the RF coil primary which resulted in shielding. This provided an asymmetric B field profile along the coil axis, which allowed an asymmetric overlap with the birdcage. Note this asymmetric B field profile, mandated its overlap with the birdcage.

Figure 11A:
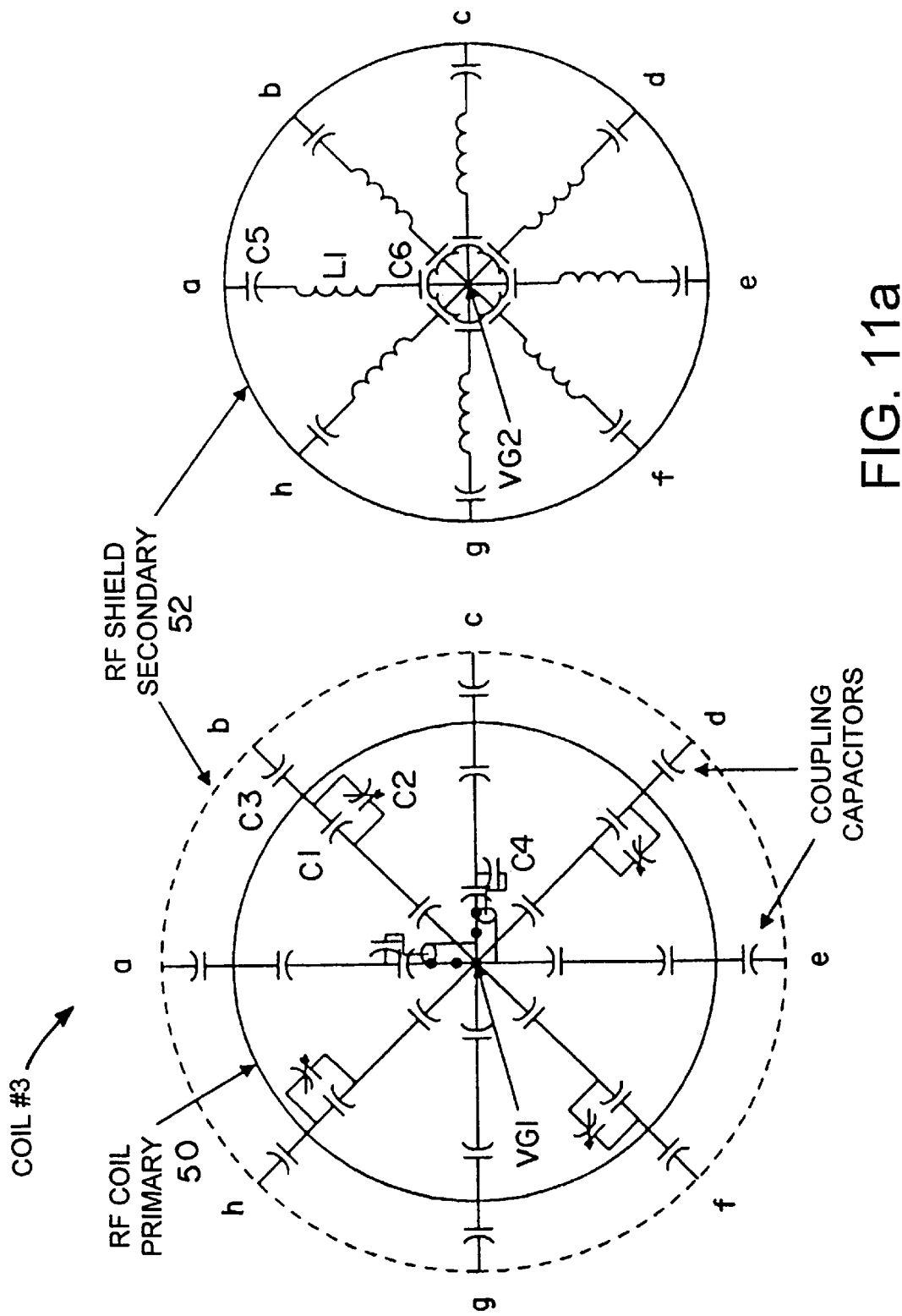
FIG. 11a is a detailed schematic illustration of the modified quadrature surface coil of FIG. 9b including coupling circuitry in accordance with the present invention.

A planar schematic of the modified surface coil including the coupling are shown in FIG. 11a. Each spoke of the primary RF coil was split with two C1 capacitors, whereas the secondary was split by C5 and C6. L1 is the self inductance for the primary and the secondary spoke circuit. The primary and secondary were bridged with coupling capacitors C3. Trimmer capacitors C2 were utilized for fine tuning the NMR coil. The coil was coupled at two places 90° apart, and across C1 in spokes a and c, respectively. The matching capacitors utilized were C4. In this design, VG1 and VG2 points were shorted and served as a guide to the coupling coaxial cables exiting the RF coil. The symmetry of this coil design forced these points to be at a virtual ground potential. Exiting the coil at these points eliminated any currents on the shields of the coaxial cables and prevented spurious cable resonances.

Figure 11B:
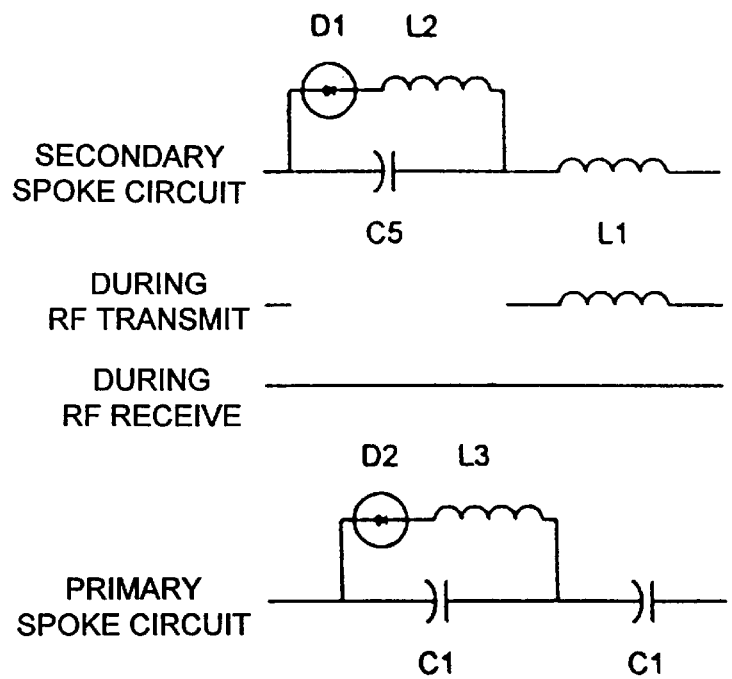
FIG. 11b is a schematic diagram of the decoupling circuitry in accordance with the preferred embodiment of the present invention.

The active decoupling circuitry of one secondary and primary spoke are shown in FIG. 11b. During RF transmit, D1 was turned ON and the parallel tank of C2-L5 presented a high impedance to the circulating currents. Similarly, the C1-L3 parallel tank presented a high impedance to the circulating currents in the primary RF coil. Please note, the entire coil was actively decoupled as shown here. Thus this coil was transparent to the whole-body uniform transmit field. However during receive, the pin diodes D1 and D2 were reversed biased and the entire coil was resonant as shown in FIG. 11a.

Figure 12:
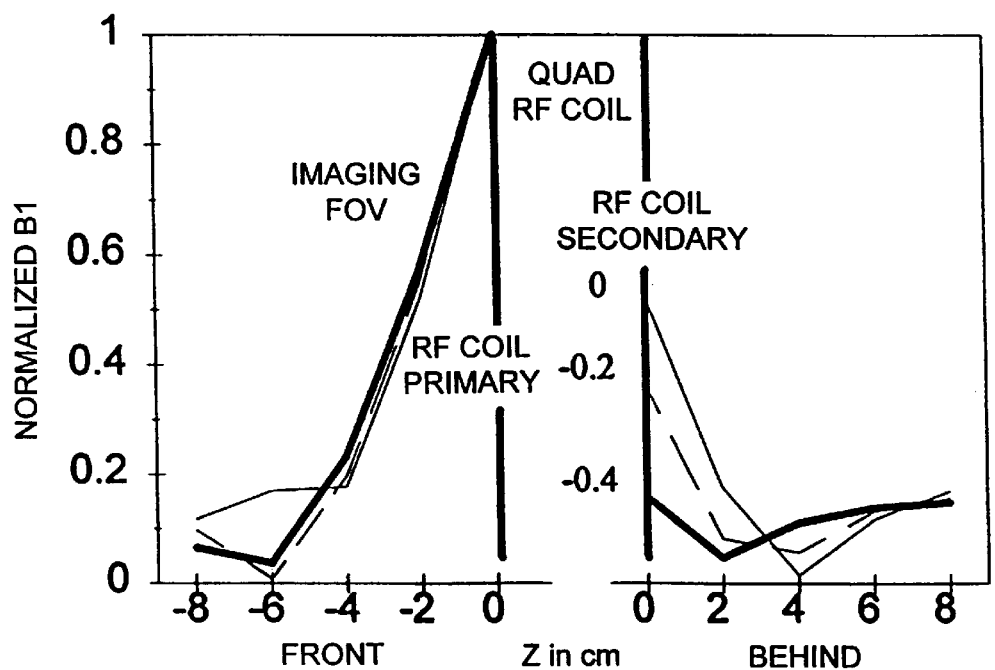
FIG. 12 is a normalized plot of the B field along the coil axis in accordance with the present invention.

FIG. 12 is a simulation for the B field along the axis for coil #3 of the proposed design. This coil was 25.4 cm in diameter, had 8 spokes, a VG point diameter of 1.75 cm and the primary and the secondary were separated by 2.0 cm. The σ values used were 0.0, 0.2 and 0.4, respectively. As seen, the σ value of 0.4 presented a highly asymmetric profile on either side of the coil, without significantly compromising signal intensity over the imaging FOV. This can be seen by comparing this profile with the profile where σ is 0.

The inventor has built and system tested a 8 spoke prototype, 23 cm in diameter, a VG of 2.0 cm and a σ of 0.4 (C1, C2, C3, C4, C5, C6 values were 82 pF, 1–23 pF, 0 pF, 117 nH, 100 pF, 1000 pF, respectively). The inventor also overlapped this coil to a conventional head birdcage (30 cm dia, 30 cm long), and obtained high S/N data toward the top of the head. For more details, please refer to the abstract submitted to the 5th ISMRM (R. Srinivasan, "S/N *Improvement in a Conventional Head Coil Toward Top of the Head*", submitted to 5th ISMRM, Vancouver, British Columbia, 1997 . . . , discussed supra).

Coil Overlap:

Construction according to the preferred embodiment is as follows. Coils #1 and #2 will be nominally overlapped to achieve minimal cross talk. Then coil #1 will be removed and a nominal overlap will be achieved between coils #2 and #3. If this overlap is greater than 4.0 cm then coil #3 will be redesigned to attain this overlap. Coil #1will be re-introduced and the isolation between coils #2 and #3 will be remeasured. If this isolation changed dramatically, then it means coils #1 and #3 are interacting. Field plots and images obtained from the quadrature surface coil prototype reveal that the field falls off very rapidly along the coil axis. Hence, little or no cross-talk between coils #1 and #3 is anticipated.

In all cases, an isolation of at least −20 dB will be achieved between coils in the array (a −20 dB isolation between two coils with equal contribution over a common volume reduces the S/N to about 1% which is tolerable in most circumstances, whereas a −6 dB gives rise to about a 10% loss, which is not tolerable). Therefore, a −20 dB was chosen as a reasonable number for a minimum achievable isolation between coils in the array. Please refer to the article by Tropp, J. and K. Derby, "*The Loss of Signal to Noise Due to Imperfect Isolation Between Channels of a Quadrature Nuclear Magnetic Resonance Probe*", Review of Science Instrumentation 62(11), pages 2646–2653, November 1991 for details regarding this topic.

Coil-to-Coil Decoupling:

In any RF coil array, cable routing is an important factor. An efficient cable routing will lead to an optimal coil design. Should the coaxial cables traverse close to the RF coil, design efforts must be made to maintain cross-talk between neighboring coils to a minimum, and little or no currents be present on the ground shields of the coax when exiting the coil assembly. Should one fail to achieve the former, optimization (tuning, matching and isolation between modes in the quadrature coil and between modes in the neighboring coils) of this coil assembly will be almost impossible. Should one fail to achieve the latter, the coaxial cables will present spurious resonances and will shift the coil frequencies depending on the coil location inside the magnet bore. The shields of these cables will also pick up RF from the whole-body coil during RF transmit. This will affect the transmit field in the imaging FOV and will produce undesirable image artifacts. To substantially minimize these problems and to easily optimize the coils in the array, the use of coil-to-coil decoupling electronics is necessitated.

For the proposed design, the coil-to-coil decoupling electronics consists of passive cable traps and a guard ring. The coaxial cable traps tuned close to the NMR frequency will serve three major functions;

1. The main function was to present a high impedance (Z) for currents flowing on the shields of the cables during RF transmit, there by preventing the formulation of closed ground loops inside the magnet bore.
2. The second function of these bidirectional traps were to present a high impedance to currents induced on both sides of the trap and to isolate one side from another.
3. The third function of these traps were to minimize the cross-talk between the coils in the array where the cable traversed.

One preferred design for the passive coil-to-coil decoupling electronics is illustrated in FIG. 3. This consists of shielded coaxial cable traps 28 for coil #1 and #3 and the guard ring 30 of coil #2. The posterior trap is strategically located under coil #1 and #2 overlap. This was to isolate the currents on the shield exposed to coil #1 to the currents induced on the shield exposed to coil #2. Whereas, for the superior trap the function was slightly different. Should coil #2 see the coaxial cable exiting coil #3, currents will be induced in the cable shield. The main function for this superior trap was to reduce this effect to a minimum before shorting the cable shield to the guard ring. The need for this superior trap is yet to be determined. The coaxial traps will be tuned with fixed value capacitors and fine tuned with variable capacitors to the NMR frequency. Due to close proximity, the traps will be shielded to isolate from the coils in the array and from the whole-body coil during RF transmit and to reduce the radiation from the shields of the straight segments of the coaxial cable.

The guard ring 30 serves a major function of providing a ground path for the several coaxial cables. This guard ring will be broken with large value RF shorting capacitors to reduce any gradient induced eddy currents, while letting the RF currents to flow. The coax shields will be kept very close to one another while exiting the coil assembly to virtually eliminate ground loops.

After reading the above, it should now be readily apparent for people skilled in the art, that several quadrature coils may be overlapped with the birdcage coil and a reliable non-active means may be used to decouple the coils in the array, and to maintain minimum cross-talk between them. The coils mentioned here, may be shaped to provide uniform coverage over the imaging FOV. It may also be noted that the birdcage and the distributed surface coil in the array may be of a low-pass, high-pass, band-pass or band-stop configurations. It should be also apparent by now that the array may be used in any of the operating mode. Also, the traps may be designed slightly different than mentioned above, and that several traps may be employed in the design. The above array may also be un-split (that is, the above array may not be a split-top design).

Figure 13:
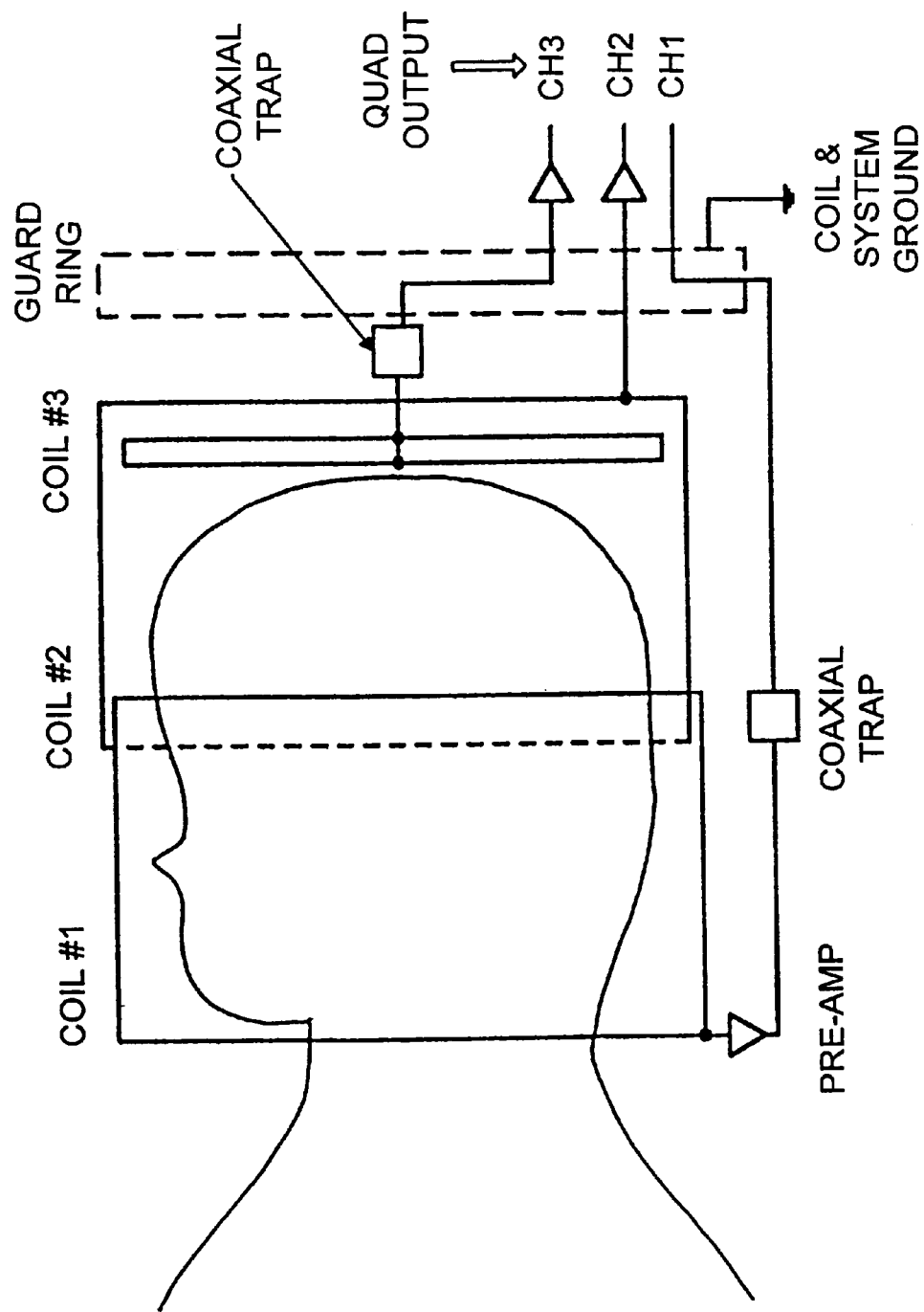
FIG. 13 is a schematic representation of an another embodiment of the present invention.

FIG. 13 represents another embodiment of the invention. Here, coil #1 of FIG. 3 is replaced by a birdcage, and this application is for imaging the head. A two birdcage design was patented by Misic (see U.S. Pat. No. 5,258,717). The present invention adds a third quadrature surface coil of the modified design (see FIGS. 9–11), to the two birdcage coil to further improve the S/N toward the top of the head without compromising $B_1$ homogeneity. In addition, non-active circuits have been included to decouple the coils and minimize the cross-talk between all coils in the array. This has facilitated newer operating modes, never before offered in the entire MR industry, with particular focus to upper or lower portions of the brain or for routine head studies in one clinical setting, with high S/N and without significantly compromising homogeneity. The following table illustrates the operating modes and individual coil status.

TABLE 2

Individual Coil Status

| Operating Modes | Coil #1 | Coil #2 | Coil #3 |
|---|---|---|---|
| Upper Brain | OFF | ON | ON |
| Lower Brain | ON | OFF | OFF |
| Routine Head | ON | ON | ON |

The clinical features of this innovative coil design are its multiple mode operation, viz., (1) upper Brain studies UB; (2) lower brain studies LB; and (3) routine head H.

Another embodiment of the invention includes a scaled down version to image the brain, heart and lung of premature infants—Pediatric array. Yet another embodiment may include a lower extremity array for peripheral vascular angiographic imaging of the carotids, especially for diabetics.

It is to be noted for all the four designs mentioned above, individual coils in the array may be shaped in such a way to provide a high S/N and uniform coverage over the imaging FOV. The coils may also be used to image in the several operating modes. The signal may be combined prior to the preamplifier or post the preamplifier in analog or digital fashion. The individual coils in the array may be tuned to one or more frequencies. Several traps may be employed in the design. Un-split versions may be used as well.

The array design may be used for NMR, MRI, electron spin resonance ESR, nuclear quadruple resonance NQR, etc. purposes, and in conjunction with a imaging/spectrometer system for image or spectral analysis of biological or non-biological samples.

The advantages of this invention over the prior art are in providing a high S/N over an extended coverage without substantially compromising $B_1$ homogeneity, in all the operating modes.

The new features of the invention include a unique combination of volume coils, including non-active circuits for decoupling individual coils and to minimize cross-talk between coils in the array; the RF distribution in each coils in the array are independent of one another, with each coil maintaining their own preferred orientation; the invention offers a coil capable of operating in multiple modes without compromising S/N, $B_1$ uniformity and image resolution; The invention offers multiple studies to be performed in one patient setting; and the invention offers extended FOV coverage without compromising image quality.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A radio-frequency (RF) coil apparatus for resonance imaging/analysis, comprising:
   a first quadrature volume coil;
   a second quadrature volume coil at least partially overlapping the first quadrature volume coil; and
   a quadrature surface coil at least partially overlapping the second quadrature volume coil and having a magnetic field substantially overlapping a magnetic field of the second quadrature volume coil.

2. The RF coil apparatus of claim 1, wherein the overlapping of the second quadrature volume coil with the first quadrature volume coil and the overlapping of the quadrature surface coil with the second quadrature volume coil is configured to substantially minimize mutual inductance therebetween at a resonance imaging frequency of interest.

3. The RF coil apparatus of claim 1, wherein first quadrature volume coil, the second quadrature volume coil, and the quadrature surface coil are selectively operable to provide a generally uniform magnetic field within a volume formed by the combination thereof at a resonance imaging frequency of interest.

4. The RF coil apparatus of claim 1, wherein the first quadrature volume coil comprises a helmholtz pair coils.

5. The RF coil apparatus of claim 1, wherein the first quadrature volume coil comprises a birdcage coil.

6. The RF coil apparatus of claim 1, wherein the second quadrature volume coil comprises a birdcage coil.

7. The RF coil apparatus of claim 6, wherein the first quadrature volume coil is located proximate one end of the birdcage coil and the quadrature surface coil is located proximate the other end of the birdcage coil, a length of the birdcage coil being selected such that a head of a patient is received in the birdcage coil during resonance imaging, and the first quadrature volume coil is positioned and sized to encompass a neck of the patient.

8. The RF coil apparatus of claim 7, further comprising coupling circuitry to permit selective imaging of the head, neck and head with neck.

9. The RF coil apparatus of claim 6, wherein the first quadrature volume coil is located proximate one end of the birdcage coil and the quadrature surface coil is located proximate the other end of the birdcage coil, a length of the birdcage coil being selected such that an upper brain portion of a head of a patient is received in the birdcage coil during resonance imaging, and the first quadrature volume coil comprises another birdcage coil which is positioned and sized to encompass a lower brain portion of the patient.

10. The RF coil apparatus of claim 9, further comprising coupling circuitry to permit selective imaging of the upper portion, the lower portion, and the upper portion with the lower portion.

11. The RF coil apparatus of claim 1, wherein the quadrature surface coil comprises a primary coil and a secondary coil coupled together to produce a magnetic B field which is asymmetric relative to an axis of the quadrature surface coil at a resonance imaging frequency of interest.

12. The RF coil apparatus of claim 11, wherein the second quadrature volume coil comprises a birdcage coil.

13. The RF coil apparatus of claim 12, wherein the quadrature surface coil is positioned within and near an end of the birdcage type coil.

14. The RF coil apparatus of claim 13, wherein another end of the birdcage type coil is sized to receive a human head to be evaluated.

15. The RF coil apparatus of claim 1, wherein the first quadrature volume coil includes a first loop coupled to a second loop forming a first mode, a third loop coupled to a fourth loop forming a second mode.

16. The RF coil apparatus of claim 1, wherein the first quadrature volume coil includes two counter-rotating pairs.

17. The RF coil apparatus of claim 16, wherein the counter-rotating pairs are helmholtz pairs.

18. The RF coil apparatus of claim 17, wherein the second quadrature volume coil is a birdcage coil.

19. The RF coil apparatus of claim 1, wherein the RF coil apparatus has multiple mode operation in order to image different areas of a body of an object under investigation.

20. The RF coil apparatus of claim 1, wherein the quadrature surface coil is positioned within and near an end of the second quadrature volume coil.

21. A radio-frequency (RF) coil apparatus for resonance imaging/analysis, comprising:
    an RF volume coil sensitive to RF signals produced during resonance imaging/analysis; and
    an RF surface coil, also sensitive to the RF signals, physically positioned relative to the RF volume coil to share a common axis and to produce a substantial overlap of the magnetic fields of the respective coils at a frequency of the RF signals.

22. The RF coil apparatus of claim 21, wherein the RF volume coil comprises a birdcage type coil.

23. The RF coil apparatus of claim 22, wherein the RF surface coil is positioned within and near an end of the birdcage type coil.

24. The RF coil apparatus of claim 23, wherein another end of the birdcage type coil is sized to receive a human head to be evaluated.

25. The RF coil apparatus of claim 21, wherein the overlap of the magnetic B fields is asymmetric.

26. The RF coil apparatus of claim 21, further comprising another RF volume coil sensitive to the RF signals and physically positioned relative to the RF volume coil to produce an overlap of the magnetic B fields of the respective coils.

27. A radio-frequency (RF) coil apparatus for resonance imaging/analysis, comprising:
    a first quadrature volume coil;
    a second quadrature volume coil at least partially overlapping the first quadrature volume coil;
    a quadrature surface coil at least partially overlapping the second quadrature volume coil and having a magnetic field substantially overlapping a magnetic field of the second quadrature volume coil; and
    coil-to-coil decoupling circuitry for preventing closed ground loops.

28. The RF coil apparatus of claim 27, wherein the coil-to-coil decoupling circuitry comprises coaxial cable traps tuned close to a resonance imaging frequency of interest, a first of said traps being located in a cable providing an RF signal connection to the first quadrature volume coil and a second of said traps being located in a cable providing an RF signal connection to the quadrature surface coil.

29. The RF coil apparatus of claim 28, wherein the first trap is positioned adjacent the overlapping of the first quadrature volume coil and the second quadrature volume coil.

30. The RF coil apparatus of claim 28, wherein the coil-to-coil decoupling circuitry further comprises a guard ring of the second quadrature volume coil.

31. The RF coil apparatus of claim 30, wherein the guard ring functions to provide a ground path for coaxial cables connected to respective RF signal connections of each of the first quadrature volume coil, the second quadrature volume coil, and the quadrature surface coil.

32. A radio-frequency (RF) coil apparatus for resonance imaging/analysis, comprising:
    a first quadrature volume coil;
    a second quadrature volume coil at least partially overlapping the first quadrature volume coil; and
    a quadrature surface coil at least partially overlapping the second quadrature volume coil
    wherein the first quadrature volume coil comprises third and fourth volume coils.

33. The RF coil apparatus of claim 32, wherein the third volume coil includes a first counter-rotating pair and the fourth volume coil includes a second counter-rotating pair.

34. The RF coil apparatus of claim 32, wherein at least one of the second quadrature volume coil and the quadrature surface coil comprises a combination of two or more coils.

* * * * *